United States Patent
Long et al.

(10) Patent No.: US 10,163,939 B2
(45) Date of Patent: Dec. 25, 2018

(54) THIN FILM TRANSISTOR ARRAY SUBSTRATE AND DISPLAY DEVICE

(71) Applicant: BOE TECHNOLOGY GROUP CO., LTD., Beijing (CN)

(72) Inventors: Chunping Long, Beijing (CN); Yong Qiao, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/552,242

(22) PCT Filed: Jan. 9, 2017

(86) PCT No.: PCT/CN2017/070622
§ 371 (c)(1),
(2) Date: Aug. 18, 2017

(87) PCT Pub. No.: WO2017/197913
PCT Pub. Date: Nov. 23, 2017

(65) Prior Publication Data
US 2018/0190671 A1    Jul. 5, 2018

(30) Foreign Application Priority Data

May 16, 2016    (CN) .................... 2016 2 0442368 U

(51) Int. Cl.
*H01L 27/12*    (2006.01)
*H01L 29/49*    (2006.01)
*H01L 29/786*    (2006.01)

(52) U.S. Cl.
CPC ............ *H01L 27/124* (2013.01); *H01L 27/12* (2013.01); *H01L 27/127* (2013.01);
(Continued)

(58) Field of Classification Search
CPC ............. H01L 27/124; H01L 29/78678; H01L 27/127; H01L 29/78675; H01L 29/4908
See application file for complete search history.

(56) References Cited

U.S. PATENT DOCUMENTS

2008/0173873 A1*   7/2008   Ishii ................ H01L 29/41733
                                            257/72
2008/0210941 A1*   9/2008   Watanabe ......... H01L 29/41733
                                            257/59

FOREIGN PATENT DOCUMENTS

CN    102709328 A    10/2012
CN    103928472 A     7/2014
(Continued)

OTHER PUBLICATIONS

International Search Report and Written Opinion dated Apr. 12, 2017, for corresponding PCT Application No. PCT/CN2017/070622.

*Primary Examiner* — Syed Gheyas
(74) *Attorney, Agent, or Firm* — Kinney & Lange, P.A.

(57) ABSTRACT

The present disclosure provides a thin film transistor array substrate and a display device implementing the same. The thin film transistor array substrate includes a substrate; a first signal line formed on the substrate; and a thin film transistor formed on the substrate, and an active layer of the thin film transistor and the first signal line are located on different layers above the substrate and projections of them on a plane where the substrate is located overlap with each other at at least two positions. The present disclosure may improve wiring efficiency and reliability of the thin film transistor array substrate.

19 Claims, 5 Drawing Sheets

(52) U.S. Cl.
CPC .... *H01L 29/4908* (2013.01); *H01L 29/78675* (2013.01); *H01L 29/78678* (2013.01)

(56) References Cited

FOREIGN PATENT DOCUMENTS

| CN | 203871327 U | 10/2014 |
| CN | 205789971 U | 12/2016 |

\* cited by examiner

THIN FILM TRANSISTOR ARRAY SUBSTRATE AND DISPLAY DEVICE

CROSS-REFERENCE TO RELATED APPLICATIONS

The present application claims priority to Chinese Patent Application NO. 201620442368.8, filed on May 16, 2016, entitled "THIN FILM TRANSISTOR ARRAY SUBSTRATE AND DISPLAY DEVICE", which is incorporated herein by reference in its entirety.

BACKGROUND OF THE INVENTION

Field of the Invention

The present disclosure relates to technical field of display, and particularly to a thin film transistor array substrate and a display device.

Description of the Related Art

Active matrix display device is a display device in which thin film transistor is configured for drive of pixels for display, and possesses advantages of thin thickness, light weight, low power consumption, low radiation and low cost, and thus becomes mainstream display technology.

The active matrix display device commonly includes a thin film transistor (TFT) array substrate. The thin film transistor array substrate includes a plurality of gate lines in a first direction and a plurality of data lines in a second direction, which defines a plurality of pixel units arrayed in a matrix.

Currently, the thin film transistor array substrate normally has a single kind of structure and thus lack novel design. Further, wiring efficiency of the existing thin film transistor array substrate is still needed to be improved and reliability of the thin film transistor and display quality both are still not perfect.

SUMMARY OF THE INVENTION

The present disclosure provides a novel thin film transistor array substrate, in which wiring efficiency is improved, and reliability of the thin film transistor and display quality may be improved.

According to an aspect of the present disclosure, there is provided a thin film transistor array substrate. The thin film transistor array substrate includes a substrate; a first signal line formed above the substrate; and a thin film transistor formed above the substrate, wherein an active layer of the thin film transistor and the first signal line are located in different layers above the substrate and projections of the active layer of the thin film transistor and the first signal line on a plane where the substrate is located overlap with each other at at least two positions.

In an embodiment, in the thin film transistor array substrate of the present disclosure, the thin film transistor and the first signal line are independent of each other; or the first signal line comprises: a gate electrode of the thin film transistor; wherein the gate electrode is configured such that a projection of the gate electrode on the substrate coincides with the first signal line, or the projection of the gate electrode on the substrate extends outside of the first signal line.

In an embodiment, in the thin film transistor array substrate of the present disclosure, the active layer of the thin film transistor comprises: an active layer overlapping section; the active layer overlapping section comprises at least one folded portion and a projection of the at least one folding portion on the plane where the substrate is located overlaps with the projection of the first signal line on the plane where the substrate is located at two, three or four positions; or the active layer overlapping section comprises a pattern including at least one side opening, and a projection of the pattern on the plane where the substrate is located overlaps with the projection of the first signal line on the plane where the substrate is located at two, three or four positions.

In an embodiment, in the thin film transistor array substrate of the present disclosure, the active layer overlapping section is in a shape of "U" and overlaps with the projection of the first signal line on the plane where the substrate is located at two positions; or the active layer overlapping section is in a shape of character "ılı" or "W" and overlaps with the projection of the first signal line on the plane where the substrate is located at three positions.

In an embodiment, the thin film transistor array substrate of the present disclosure further includes a second signal line, wherein the first signal line and the second signal line define a functional region corresponding to at least one thin film transistor.

In an embodiment, in the thin film transistor array substrate of the present disclosure, the active layer overlapping section is in a shape of "U" and overlaps with the projection of the first signal line on the plane where the substrate is located at two positions;

the active layer overlapping section crossing the first signal line forms a first channel portion and a second channel portion of the thin film transistor, which are located at either side of the second signal line.

In an embodiment, in the thin film transistor array substrate of the present disclosure, a section of the second signal line located at a side of the functional region is formed as a signal line shifting section; the signal line shifting section shifts in a direction perpendicular to a general extending direction of the second signal line by a preset distance and the first channel portion and the second channel portion of the thin film transistor are located at either side of the signal line shifting section.

In an embodiment, in the thin film transistor array substrate of the present disclosure, the first channel portion and the second channel portion of the thin film transistor are symmetrical about the signal line shifting section.

In an embodiment, in the thin film transistor array substrate of the present disclosure, the projection of the signal line shifting section on the plane where the substrate is located is close to the first channel portion and apart away from the second channel portion, or the projection of the signal line shifting section on the plane where the substrate is located partially overlaps with a projection of the first channel portion on the plane where the substrate is located.

In an embodiment, in the thin film transistor array substrate of the present disclosure, different signal line shifting sections of the second signal line shift in the same direction or different directions.

In an embodiment, in the thin film transistor array substrate of the present disclosure, the signal line shifting section shifts from the general extending direction of the second signal line by a distance d1, and 1 µm≤d1≤10 µm; and/or a distance d2 between the first channel portion of the thin film transistor and the signal line shifting section satisfies 1 µm≤d2≤10 µm.

In an embodiment, in the thin film transistor array substrate of the present disclosure, the signal line shifting section shifts, relative to the general extending direction of the second signal line, in a direction towards or away from the functional region by the present distance.

In an embodiment, in the thin film transistor array substrate of the present disclosure, the signal line shifting section shifts, relative to the general extending direction of the second signal line, in a direction away from the functional region by the present distance; the active layer further comprises an active layer connection section connecting a second portion of the active layer overlapping section that is apart away from the functional region with the second signal line.

In an embodiment, in the thin film transistor array substrate of the present disclosure, the signal line shifting section shifts, relative to the general extending direction of the second signal line, in a direction towards the functional region by the present distance; a second portion of the active layer overlapping section that is apart away from the functional region is aligned with the general extending direction of the second signal line.

In an embodiment, in the thin film transistor array substrate of the present disclosure, a portion of the second signal line at a side of the functional region extends along a straight line;
the active layer further comprises an active layer connection section connecting a second portion of the active layer overlapping section that is apart away from the functional region with the second signal line.

In an embodiment, in the thin film transistor array substrate of the present disclosure, the first signal line, the second signal line and a plurality of thin film transistors are formed in a display region of the thin film transistor array substrate; the first signal line is a gate line, the second signal line is a data line, two adjacent gate lines and two adjacent data lines define a pixel region, a first end of the thin film transistor is electrically connected to the data line and a second end of the thin film transistor is electrically connected to a pixel electrode in the pixel region.

In an embodiment, in the thin film transistor array substrate of the present disclosure, the second portion of the active layer overlapping section away from the pixel region is electrically connected to the data line through a first through hole; the first portion of the active layer overlapping section close to the pixel region is electrically connected to the drain electrode of the thin film transistor through a second through hole and is electrically connected to the pixel electrode in the pixel region through a third through hole.

In an embodiment, in the thin film transistor array substrate of the present disclosure, the first signal line and the thin film transistor are formed in a non-display region of the thin film transistor array substrate; a first end of the thin film transistor is electrically connected to the first signal line, the first signal line is a gate line or a data line, and a second end of the thin film transistor is electrically connected to a common electrode leading line.

In an embodiment, in the thin film transistor array substrate of the present disclosure, the first signal line and the second signal line are configured as a single-layer structure or a dual-layer structure.

In an embodiment, in the thin film transistor array substrate of the present disclosure, the thin film transistor is a dual-gate thin film transistor with a top gate structure, a gate insulating layer is formed over the active layer and the first signal line is formed over the gate insulating layer; an interlayer separation layer is provided over the first signal line and the second signal lines passes over the interlayer separation layer.

In an embodiment, in the thin film transistor array substrate of the present disclosure, the thin film transistor is a dual-gate thin film transistor with a bottom gate structure, a gate insulating layer is formed over the first signal line and the active layer is formed over the gate insulating layer;
the second signal lines passes over the active layer and is separated from the active layer by an interlayer separation layer.

As another aspect, there is provided a display device in which the above described thin film transistor is implemented.

DETAILED DESCRIPTION OF PREFERRED EMBODIMENTS OF THE INVENTION

The present disclosure provides a new thin film transistor array substrate and a display device. The thin film transistor array substrate includes: a substrate, and a first signal line and a thin film transistor formed on the substrate. An active layer of the thin film transistor and the first signal line are located on different layers over the substrate and projections of them on a plane where the substrate is located overlap at at least two positions. The portion of the active layer overlapping with the projection of the first signal line on the plane where the substrate is located is termed as an active layer overlapping section.

In an embodiment, in a thin film transistor array substrate, the active layer overlapping section includes a folding section, or includes a pattern with at least a side opening. These two structures both may achieve overlapping at at least two positions between the projections of the active layer of the thin film transistor and the first signal line on the plane where the substrate is located.

Optionally, the pattern with at least a side opening may be such as of "U" shape, a rectangle with a side opening, "⊥⊥"

shape or "W" shape, which all may achieve overlapping at at least two positions between the projections of the active layer of the thin film transistor and the first signal line on the plane where the substrate is located.

In a specific application, a plurality of first signal lines and a plurality of second signal lines are formed, and arranged to cross one another on the substrate such that two adjacent first signal lines define a functional region together with two adjacent second signal lines. A plurality of thin film transistors are respectively formed at crossing areas where the first signal lines respectively cross the second signal lines, and each thin film transistor corresponds to a functional region adjacent to it. Herein, the functional region is meant to a region that is used for displaying, or used for providing a driving voltage, or used for testing, or used for releasing static electricity, etc.

In a typical embodiment, in a display region of the thin film transistor array substrate, the first signal line may correspond to a gate line, the second signal line may correspond to a data line and the functional region may correspond to a pixel region. The embodiments of the present disclosure will be described in detail in combination with the typical application with reference to the drawings.

The thin film transistor (TFT) unit may be implemented in a multiple gate structure in order to reduce turn-off current $I_{off}$. However, it is found in the present disclosure that the thin film transistor unit with the multiple gate structure in the prior art presents a bigger parasitic capacitance and an excessive parasitic capacitance may cause a pixel voltage error and twinkle (or flashing). Thus, there is provided at least one embodiment to reduce or eliminate the pixel voltage error and twinkle.

Figure 1A:
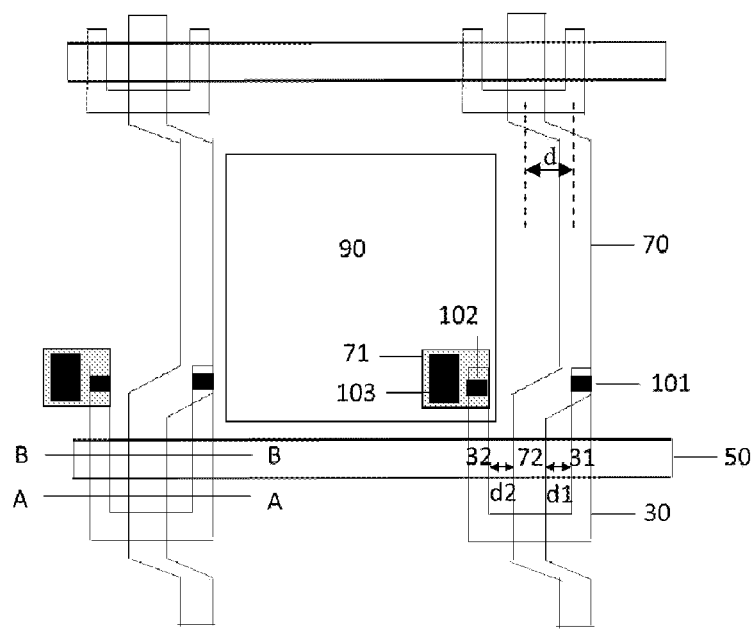
FIG. 1A is a schematic plan view of a thin film transistor array substrate including a top gate thin film transistor according to an embodiment of the present disclosure.
Figure 1B:
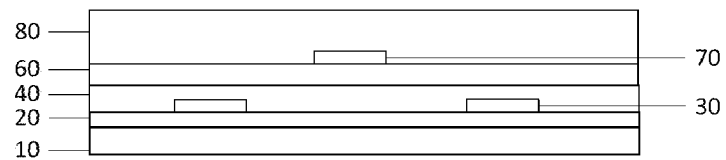
FIG. 1B is a cross-sectional view of the thin film transistor array substrate as shown in FIG. 1A, taken along A-A line.
Figure 1C:
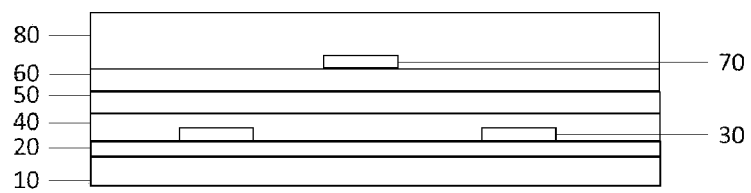
FIG. 1C is a cross-sectional view of the thin film transistor array substrate as shown in FIG. 1A, taken along B-B line.

In an embodiment of the present disclosure, there is provided a thin film transistor array substrate. FIG. 1A is a schematic plan view of a thin film transistor array substrate according to an embodiment of present disclosure. FIG. 1B is a cross-sectional view of the thin film transistor array substrate as shown in FIG. 1A, taken along A-A line. FIG. 1C is a cross-sectional view of the thin film transistor array substrate as shown in FIG. 1A, taken along B-B line.

Referring to FIG. A~1C, the thin film transistor array substrate according to the embodiment includes: a plurality of gate lines 50 and data lines 70 arranged and crossed one another; and a plurality of thin film transistors formed at crossing areas where the gate lines and the data lines one another. In the embodiment, two adjacent gate lines and two adjacent data lines together define a pixel region, which corresponds to a thin film transistor that is configured to control a pixel electrode of the pixel region.

In the embodiment, the gate electrode of the thin film transistor and the gate line are formed as an integral structure. For example, a portion of the gate line is formed as the gate electrode, and a projection of the gate electrode on the substrate is a portion of a projection of the gate line on the substrate. In other words, the projection of the gate electrode on the substrate overlaps with the projection of the first signal line on the substrate. However, it is appreciated for those skilled in the art that, in another embodiment of the present disclosure, the gate electrode of the thin film transistor may be formed as a portion of the gate line depending on requirement of process. For example, the gate electrode may be a portion that protrudes to an outside of the gate line and is coupled to the gate line by means of a connection portion. In other words, the projection of the gate electrode on the substrate extends to an outside of the first signal line.

In the embodiment, the thin film transistor is formed at the crossing area where the gate line 50 crosses or meets the data line 70. A projection of the active layer of the thin film transistor on the plane where the substrate is located is in a shape of "U", and the active layer in the shape of "U" is hereinafter termed as U-shaped active layer 30. The projections of the U-shape active layer 30 and the gate line 50 on the plane where the substrate is located, join twice or at two positions to provide a first channel portion 31 and a second channel portion 32 of the thin film transistor. Further, an end of the U-shaped active layer 30 is electrically connected to the data line 70 and the other end thereof is electrically connected to the pixel electrode 90 within the pixel region.

It is appreciated for those skilled in the art that in addition to the shape of "U", the active layers with other shapes of characters "ılı", "W", "V" and hemicycle may all achieve the function of overlapping the projections of such active layer and the gate line on the plane where the substrate is located at least twice or in at least two positions, and thus may also implement the present disclosure. Of course, the shape of "U" is a simplest form and thus is easiest to be manufactured in industry. A wiring efficiency and reliability thus may be increased by configuring the active layer in "U" shape and the first signal line such that the projections of them on the plane where the substrate is located overlap with each other twice or more, i.e., having two or more overlapped portions.

Referring to FIG. 1A and FIG. 1B, a section of the data line 70 close to the crossing area where the data line 70 crosses the gate line shifts or off-sets towards a side towards the corresponding pixel region by a preset distance, such that the data line 70 forms a zigzag-shaped folding structure. The section of the data line 70 that has such folding structure is termed in the following context as a data line shifting section 72. In the embodiment, the signal line shifting section 72 shifts towards the corresponding pixel region by the distance d in a range from 1 μm to 10 μm, i.e., satisfying an inequality of 1 μm≤d≤10 μm, with relative to a general extending direction of the data line.

In the embodiment, the data line shifting section 72 passes through the active region of the thin film transistor. In the situation as shown in FIG. 1A, with relative to the pixel region, the first channel portion 31 is located outside of the data line shifting section 72 and the second channel portion 32 is located inside of the data line shifting section 72. Further, the first channel portion 31 and the second channel portion 32 are symmetrical about the data line shifting section 72.

Referring to FIG. 1A, the outside portion of the U-shaped active layer is electrically connected to a data line non-shifting section through the first through hole 101. In the pixel region, the inside portion of the U-shaped active layer 30 is electrically connected to a drain electrode metal 71 through a second through hole 102, and is further electrically connected to the pixel electrode 90 through a third through hole 103.

In the embodiment, the thin film transistor is a dual-gate thin film transistor with a top gate structure. Referring to FIG. 1B and FIG. 1B, a buffer layer 20 is formed on a substrate 10, and a U-shaped active layer 30 is formed on the buffer layer 20. A gate insulating layer 40 is formed on the U-shaped active layer and a portion of the buffer layer that is not covered by the U-shaped active layer. A gate line 50 is formed on the gate insulating layer 40, an interlayer separation layer 60 is provided on the gate line, and a data line 70 extends on the interlayer separation layer 60 and passes through it. On the data line 70 is provided a passivation layer 80, covering the data line 70.

In the embodiment, a section of the data line 70 close to the crossing area where the data line 70 crosses or joins the gate line shifts towards the side of the corresponding pixel region by the preset distance to form the zigzag-shaped folding structure, in order to maintain a high opening rate or aperture ratio and a minimum parasitic capacitance between the data line and the active region. The active layer is designed to have a U shape symmetrical with respect to the data line shifting section such that two parallel portions of the active region are spaced apart from the data line shifting section by the same distance.

For example, the data line is distanced from a first portion (a portion of the U-shaped active layer that is close to the pixel region) of the active layer that is coupled to the source electrode of the thin film transistor by a distance of d2, and is distanced from a second portion (a portion of the U-shaped active layer that is located away from the pixel region) of the active layer that is coupled to the drain electrode of the thin film transistor by a distance of d1. The total parasitic capacitance C between the data line and the portions of the active region is quoted as below:

$$C = \varepsilon \cdot A \cdot (d1+d2)/(d1 \cdot d2)$$

Where, ε is a dielectric constant of an insulating medium between the data line and the U-shaped active layer, A is area of the parasitic capacitance. It can be seen that, when d1=d2, the total parasitic capacitance C between the data line 70 and the U-shaped active layer 30 may be maintained to be minimum value, thereby reducing the pixel voltage error and twinkle.

In the embodiment, the gate line 50 and the data line 70 may be made of a metal material such as Cu, Al, Mo, Ti, Cr, W, Nd, Nb, or an alloy of these material. The gate line or the data line may be of a single-layer structure, or may be of a multi-layer structure, such as Mo\Al\Mo, Ti\Al\Ti, Ti\Cu\Ti, Mo\Cu\Ti or the like.

In the embodiment, the U-shaped active layer 30 may be made of amorphous silicon, or low-temperature polysilicon, or oxide semiconductor. The gate insulating layer 40 may be made of silicon nitride or silicon oxide, and may be of a single-layer structure or may be of multi-layer structure, such as silicon oxide/silicon nitride.

In addition, in the embodiment, the interlayer separation layer 60 and the passivation layer 80 may be made of inorganic substance such as silicon nitride, or may be made of organic substance such as resin; the pixel electrode 90 may be made of ITO, IZO, ITZO or other transparent conductive metal oxides.

Figure 2:
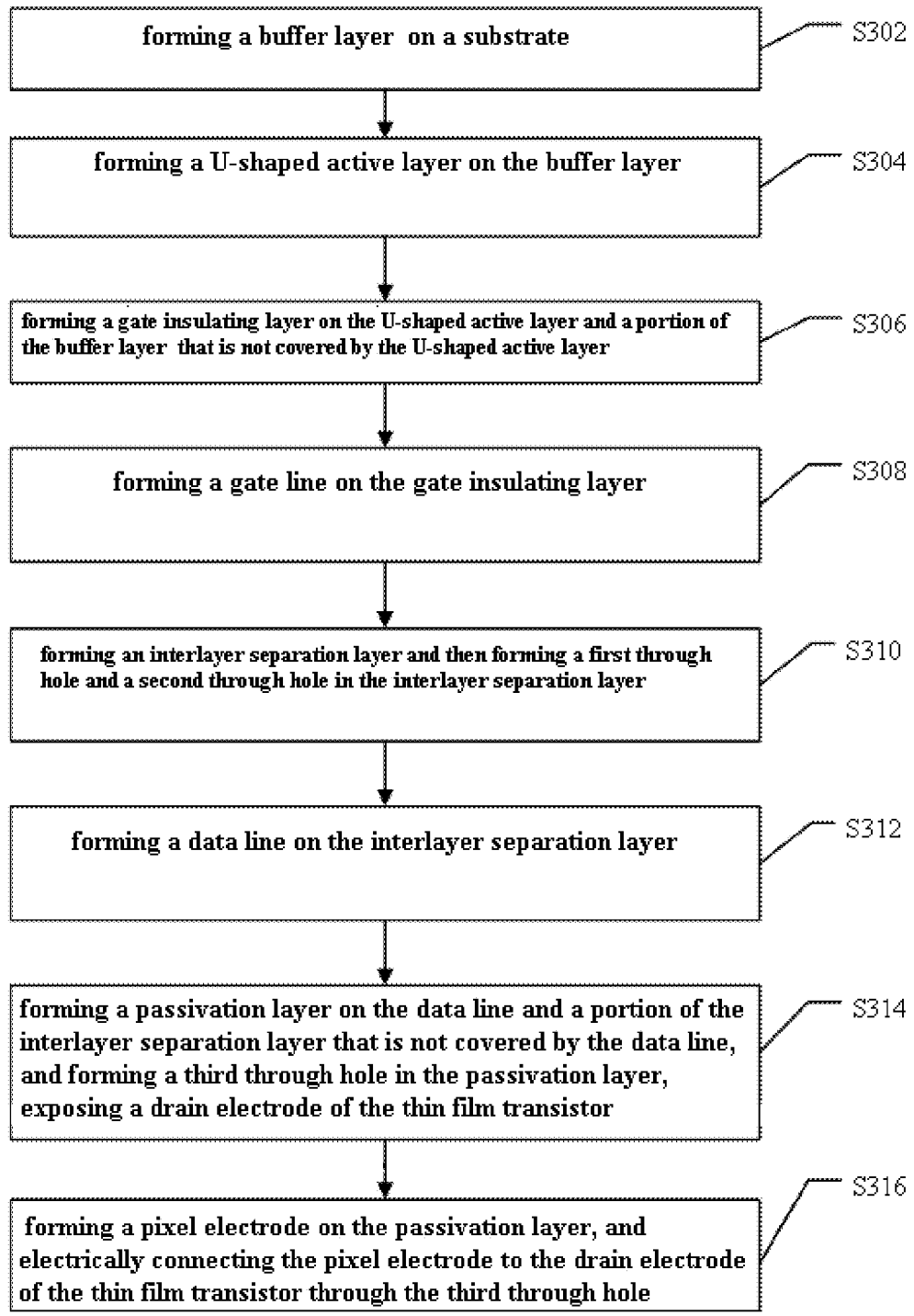
FIG. 2 is a flow chart of a method of manufacturing the thin film transistor array substrate as shown in FIG. 1A-1C.

A method of manufacturing a thin film transistor array substrate in accordance with an embodiment of the present disclosure is described below with reference to FIG. 2. The method of manufacturing the thin film transistor array substrate includes:

Step S302: forming a buffer layer 20 on a substrate;

in the step S302, the buffer layer 20 is deposited on the substrate by means of PECVD, and the buffer layer 20 may be made of a material such as silicon nitride, silicon oxide or may be a dual-film of silicon nitride-silicon oxide.

Step S304, forming a U-shaped active layer 30 on the buffer layer 20;

In step S304, a semiconductor layer is firstly deposited on the buffer layer 20; and then processes of coating photoresist, exposing and developing, and etching are performed to form the U-shaped active layer 30.

Herein, the semiconductor layer may be deposited by means of one of the following manners, such as: (1) depositing a —Si by PECVD; (2) depositing IGZO by sputtering; (3) forming low-temperature polysilicon by laser-crystallization or solid phase crystallization of a-Si.

Step S306: forming a gate insulating layer 40 on the U-shaped active layer 20 and a portion of the buffer layer 20 that is not covered by the U-shaped active layer;

In Step S306, the gate insulating layer 40 is deposited on the U-shaped active layer 20 and the portion of the buffer layer 20 that is not covered by the U-shaped active layer by means of PECVD; the gate insulating layer 40 is made of a material such as silicon oxide, or silicon oxide.

Step S308: forming a gate line 50 on the gate insulating layer;

In step S308, a metal layer is firstly deposited, and then processes of coating photoresist, exposing and developing, and etching are performed to form the gate line 50; projections of the gate line 50 and the U-shaped active layer 30 overlap with each other twice or at two positions.

Herein, the process of depositing the metal layer may specifically include depositing a metal layer such as aluminum layer by sputtering.

Step S310: forming an interlayer separation layer 60 and then forming a first through hole 101 and a second through hole 102 in the interlayer separation layer 60;

In step S310, the interlayer separation layer is firstly deposited, and then processes of coating photoresist, exposing and developing, and etching are performed to form the first through hole 101 and the second through hole 102.

Herein, the process of depositing the interlayer separation layer may specifically include: depositing a silicon nitride by PECVD to form the interlayer separation layer 60.

Step S312: forming a data line 70 on the interlayer separation layer;

In step S312, a metal layer is first deposited, and then processes of coating photoresist, exposing and developing, and etching it are performed to form the data line 70.

Herein, the process of depositing the metal layer may specifically include: depositing a metal layer such as aluminum layer by sputtering.

Step S314: forming a passivation layer on the data line 70 and a portion of the interlayer separation layer that is not covered by the data line, and forming a third through hole 103 in the passivation layer, exposing a drain electrode 71 of the thin film transistor;

In step S314, the passivation layer is firstly formed, and then processes of coating photoresist, exposing and developing, and etching are performed to form the third through hole to expose the drain electrode 71 of the thin film transistor.

Herein, the process of forming the passivation layer may specifically include: depositing a silicon nitride by PECVD, or coating a resin layer.

Step S316: forming a pixel electrode 90 on the passivation layer, and electrically connecting the pixel electrode 90 to the drain electrode 71 of the thin film transistor through the third through hole 103.

Herein, formation of the pixel electrode in the above step S316 may specifically include: sputtering a transparent conductive metal oxide layer, such as ITO, and then processes of coating photoresist, exposing and developing, and etching are performed to form the pixel electrode 90.

In the embodiment, the active layer is designed in a shape of "U" simplifying the wiring structure, while the data line is shifted to a central position between two portion of the active region that are parallel to each other, thereby minimizing the parasitic capacitance between the data line and the channel of the thin film transistor, reducing the pixel voltage error and twinkle, and thereby improving display quality.

Thus, the manufacturing process of the thin film transistor array substrate of the present embodiment is completed.

Figures 3, 4:
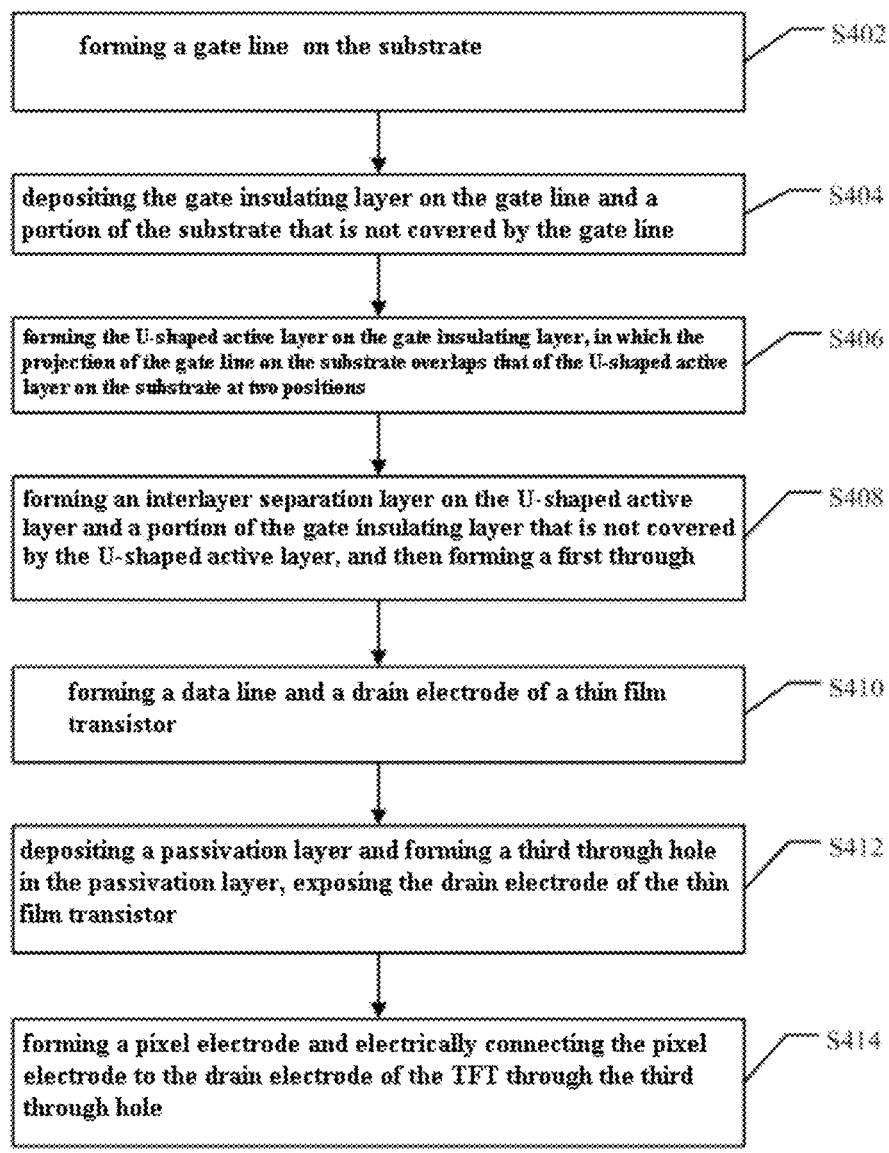
FIG. 3 is a cross-sectional view of a thin film transistor array substrate with a bottom gate thin film transistor according to another embodiment of the present disclosure, similar to FIG. 1C showing the cross sectional view taken along B-B' line.
FIG. 4 is a flow chart of a method of manufacturing the thin film transistor array substrate as shown in FIG. 3.

In another embodiment of the present disclosure, there is provided a thin film transistor array substrate. FIG. 3 is a cross-sectional view of a thin film transistor array substrate according to another embodiment of the present disclosure, similar to FIG. 1C showing the cross section view taken along B-B' line. Referring to FIG. 3, the thin film transistor array substrate in the embodiment is different from the previous embodiment in configuring the thin film transistor as a dual-gate thin film transistor with a bottom gate structure.

As shown in FIG. 3, the gate line 50 is formed on the substrate 10. The gate insulating layer 40 is formed on the gate line 50 and the U-shaped active layer 30 is formed on the gate insulating layer. The data line 70 extends through or runs on the U-shaped active layer 30 and is spaced apart from the U-shaped active layer by the interlayer separation layer 60. Further, a passivation layer 80 is formed on the data line 70.

It is appreciated for those skilled in the art that, in the thin film transistor with a bottom gate structure, a smaller distance between the layer where the data line is located and the U-shaped active layer 30 is provided and a greater parasitic capacitance is generated, which directly impacts the channel region. Thus, it is necessary to minimize the parasitic capacitance for the thin film transistor with a bottom gate structure. Due to being symmetrical, the U-shaped structure according to the embodiment may reduce the parasitic capacitance.

A method of manufacturing a thin film transistor array substrate according to an embodiment of the present disclosure is described as following. Referring to FIG. 4 together with FIG. 1A and FIG. 1B, the method of manufacturing a thin film transistor array substrate according to an embodiment of the present disclosure includes:

Step S402: forming a gate line 50 on the substrate;

In step S402, a metal layer is firstly deposited, and then processes of coating photoresist, exposing and developing, and etching are performed to form the gate line 50.

Herein, the above deposition of the metal layer may specifically include: depositing the metal layer by sputtering.

Step S404: depositing the gate insulating layer 40 on the gate line and a portion of the substrate that is not covered by the gate line;

In step S404, the gate insulating layer 40, such as silicon nitride and silicon oxide, is deposited by means of PECVD.

Step S406: forming the U-shaped active layer 30 on the gate insulating layer, in which the projection of the gate line 50 on the substrate overlaps that of the U-shaped active layer 30 on the substrate at two positions or twice.

In step S406, a semiconductor layer is firstly deposited, and then processes of coating photoresist, exposing and developing, and etching are performed to form the U-shaped active layer 30.

Herein, the above deposition of the semiconductor layer may be performed by one of the following manners: (1) formation of a —Si by PECVD; (2) deposition of the IGZO by sputtering; (3) formation of low-temperature polysilicon by laser-crystallization or solid phase crystallization of a-Si.

Step S408: forming an interlayer separation layer 60 on the U-shaped active layer and a portion of the gate insulating layer that is not covered by the U-shaped active layer, and then forming a first through hole 101 and a second through hole 102;

In step S408, a silicon nitride is firstly deposited by means of PECVD to form the interlayer separation layer 60, and then processes of coating photoresist, exposing and developing, and etching are performed to form the first through hole 101 and the second through hole 102.

Step S410: forming a data line 70 and a drain electrode 71 of a thin film transistor;

In step S410, a metal layer is deposited on the interlayer separation layer, and then processes of coating photoresist, exposing and developing, and etching are performed to form a pattern of the data line 70 and the drain electrode 71.

Herein, the above deposition of the metal layer may specifically include: depositing the metal layer such as aluminum layer by sputtering.

Step S412: depositing a passivation layer and forming a third through hole 103 in the passivation layer, exposing the drain electrode 71 of the thin film transistor;

In step S412, the passivation layer is firstly deposited, and then processes of coating photoresist, exposing and developing, and etching are performed to form the third through hole 103.

Herein, the above deposition of the passivation layer may specifically include: depositing the silicon nitride by PECVD or coating the resin layer.

Step S414: forming a pixel electrode 90 and electrically connecting the pixel electrode 90 to the drain electrode 71 of the TFT through the third through hole 103.

Herein, the above formation of the pixel electrode may specifically include: forming a transparent conductive metal oxide layer such as ITO by sputtering; and then performing processes of coating photoresist, exposing and developing, and etching to form the pixel electrode 90.

It is noted that any features that may be used for the same functions in above embodiments may be used in other embodiments and will not be repeatedly described for brief.

Figure 5:
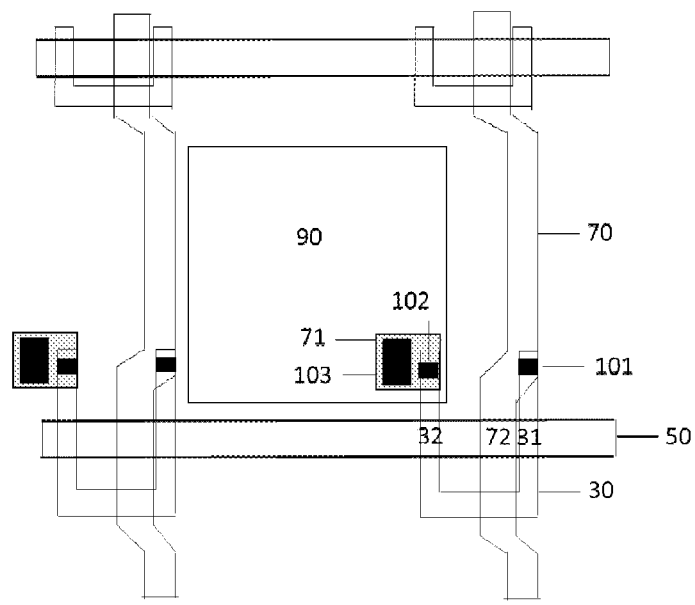
FIG. 5 is a schematic plan view of the thin film transistor array substrate according to a further embodiment of the present disclosure.

In a further embodiment of the present disclosure, there is further provided a thin film transistor array substrate. FIG. 5 is a schematic plan view of a thin film transistor array substrate according to a further embodiment of the present disclosure. Referring to FIG. 5, the difference of the thin film transistor array substrate of the embodiment from the preceding embodiments resides in: the U-shaped active layer of the thin film transistor is located at different horizontal position (with respect to the pixel region defined by the data line and the gate line).

As shown in FIG. 5, the active layer 30 of the thin film transistor is also in a shape of "U", but is not symmetrical about the data line shifting section, and is shifted further towards one side thereof. That is, for example, a horizontal distance between the first channel portion 31 and the data line shifting section 72 is less than a horizontal distance between the second channel portion 32 and the data line shifting section 72. It is appreciated that, in the embodiment as shown in FIG. 5, an outside edge of the first channel portion 31 is flush with an outside edge of the data line shifting section, thereby using the substrate area as possible as it can.

It is noted that, in another embodiment of the present disclosure, the edge portion of the data line shifting section 72 may also have a small overlapping region with the first channel portion 31.

In the embodiment, when the data line shifting section 72 is located away from the second channel portion 32, the parasitic capacitance between the data line shifting section 72 and the second channel portion 32, the parasitic capacitance between the data line shifting section 72 and the drain electrode 71 and the parasitic capacitance between the data line shifting section 72 and the pixel electrode 90 may be reduced, facilitating stability of the pixel voltage.

Figure 6:
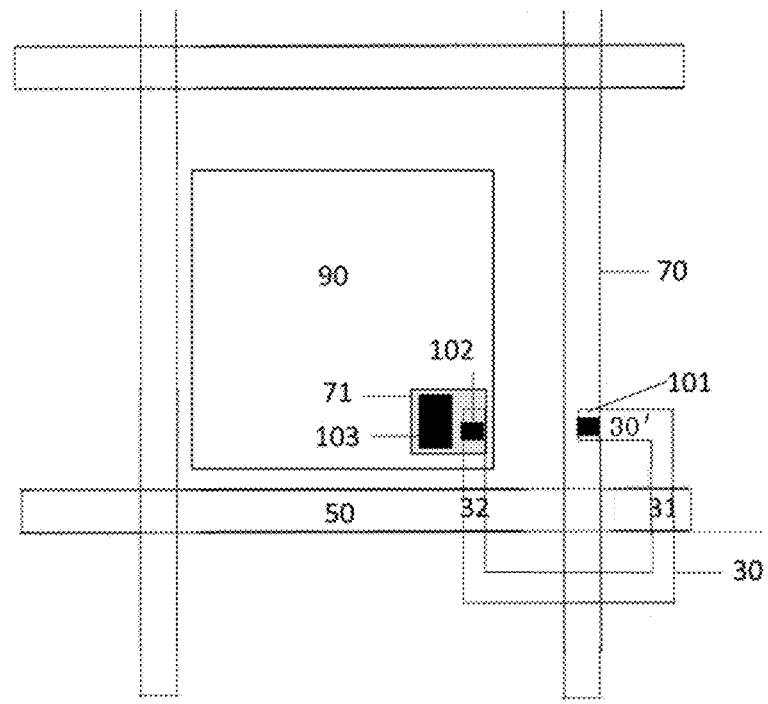
FIG. 6 is a schematic plan view of the thin film transistor array substrate according to a still further embodiment of the present disclosure.

In a still embodiment of the present disclosure, there is provided a thin film transistor array substrate. FIG. 6 is a schematic plan view of a thin film transistor array substrate according to a still embodiment of the present disclosure. Referring to FIG. 6, the difference of the thin film transistor array substrate according to the embodiment from the embodiment as shown in FIG. 1A resides in: the data line 70 has no shifting portion, instead of being configured vertically in a straight line. In other words, the data line 70 extends in a straight line. The active layer includes two sections: an active layer U-shaped section 30 and an active layer connection section 30'. In FIG. 6, the active layer U-shaped section 30 shifts towards a right side (in the plane of the sheet) and its end that is apart away from the corresponding pixel region is coupled to the data line through the active layer connection section 30'.

In other words, the active layer in the embodiment includes two sections: the active layer U-shaped section 30 and the active layer connection section 30'. Herein, a projection of the active layer U-shaped section 30 on the plane where the substrate is located is in a shape of "U", and crosses a projection of the gate line 50 on the plane where the substrate is located at two positions or twice, thereby forming the first channel portion 31 and the second channel portion 32. The first channel portion 31 and the second channel portion 32 are respectively located either side of the data line 70. The active layer connection section 30' is coupled to the second portion, apart away from the corresponding pixel region, of the U-shaped section of the active layer and the data line.

It is noted that any features that may be used for the same functions in above embodiments may be used in other embodiments and will not be repeatedly described for brief.

The active layer of the thin film transistor array substrate according to the embodiment designed in a shape of "U" may simplify the wiring structure while minimizing the parasitic capacitance between the data line and the channel of the thin film transistor and reducing pixel voltage errors and twinkle, thereby increasing display quality.

Figure 7:
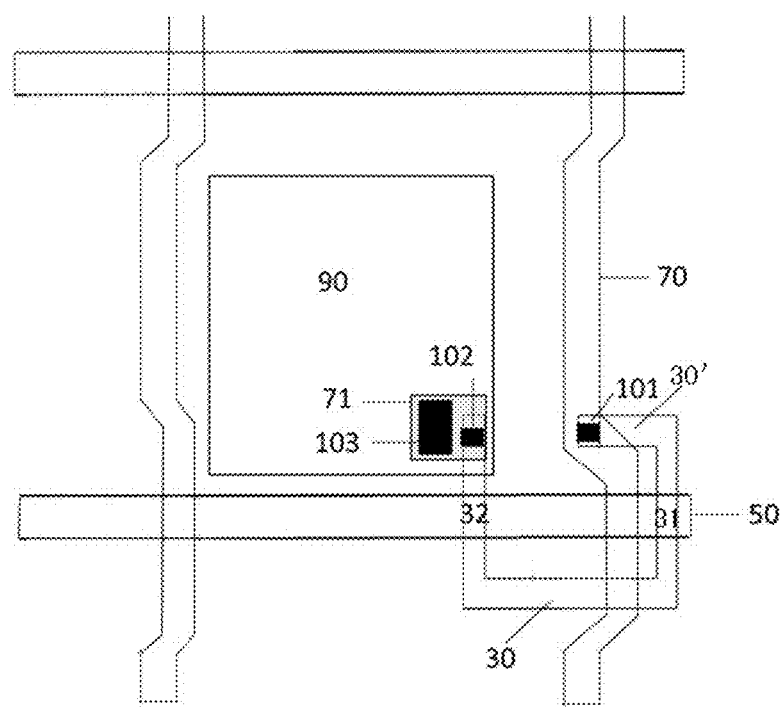
FIG. 7 is a schematic plan view of the thin film transistor array substrate according to a yet further embodiment of the present disclosure.

In another embodiment of the present disclosure, there is provided a thin film transistor array substrate. FIG. 7 is a schematic plan view of a thin film transistor array substrate according to another embodiment of the present disclosure. Referring to FIG. 7, difference of the thin film transistor array substrate of the embodiment from the previous embodiments resides in: the data line 70 shifts towards different direction, i.e., towards the right side; the active layer U-shaped section 30 shifts towards right side to a larger extent and the active layer connection section 30' becomes longer.

It is noted that any features that may be used for the same functions in above embodiments may be used in other embodiments and will not be repeatedly described for brief.

The active layer of the thin film transistor array substrate according to the embodiment designed in a shape of "U" may simplify the wiring structure while minimizing the parasitic capacitance between the data line and the channel of the thin film transistor and reducing the pixel voltage errors and twinkle, thereby increasing display quality.

In another embodiment of the present disclosure, there is provided a thin film transistor array substrate. Different from the previous embodiments, the present embodiment includes a new wiring structure in non-display region of the thin film transistor array substrate. In the thin film transistor array substrate, the first signal line is the gate line or the data line, instead of other signal line. A first end of each thin film transistor is electrically connected to the gate line (or the data line) and a second end of the thin film transistor is electrically connected to a common electrode leading line.

It is appreciated for those skilled in the art that in the embodiment, the thin film transistor and the gate line (or the data line) are independent of each other and no electrical connection is provided therebetween.

It is known by combining the embodiment and the above embodiments that relationships between the thin film transistor and the first signal line may be classified into three types: the thin film transistor and the first signal line are independent of each other; or, the first signal line includes the gate electrode of the thin film transistor; or, the first signal line and the gate electrode of the thin film transistor are configured as an integral structure.

The embodiment is a non-typical application of the present disclosure. Other applications of the present disclosure may be obtained by those skilled in the art by combining the embodiment and the above embodiments, and are not listed herein one by one.

An embodiment of the present disclosure provides a display device including the thin film transistor array substrate of any one of the above embodiments.

Specifically, the display device includes the thin film transistor array substrate according to any one of the above embodiments and a color filter substrate.

A plurality of embodiments of the present disclosure have been described in detail with reference to the accompanying drawings above. Based on the above description, those skilled in the art should definitely acknowledge the thin film transistor array substrate and the display device implementing the same of the present disclosure.

The "substrate" herein may include any base substrate substance on which devices, circuit, epitaxial layers or semiconductors may be formed. Generally, the substrate may be used to define a layer underside a semiconductor device(s), or a base layer for a semiconductor device(s). The substrate may be made of any one or any combination of the following including silicon, doped silicon, germanium, silicon germanium, semiconductor compound, and other semiconductor materials.

It is known from its name "dual gate thin film transistor (TFT)" that it herein is directed to a thin film transistor having two gates. The dual-gate thin film transistor with a bottom gate structure is directed to a dual-gate thin film transistor with a gate electrode being located below an active layer; the dual-gate thin film transistor with a top gate structure is directed to a dual-gate thin film transistor with a gate electrode being located above an active layer. The above names are terms commonly used in the art and may be referred to a textbook or terminological dictionary, and are not repeatedly described.

It is noted that, in the drawings or specification, embodiments that are not illustrated in the drawings or are not described in the specification are all known by those skilled in the art and are not described in detail. In addition, the above definitions of the elements and methods are not intended to limit the specific structures, shapes or manners as mentioned in the above embodiments and can be simply replaced or modified by those skilled in the art in such as the following way:

The thin film transistors of the plurality of embodiments of the present disclosure may be replaced by thin film transistors with other feasible structures;

The materials for forming the gate line, the data line and the active layer may be other suitable material in addition to the materials listed in the embodiments herein;

The gate line and the data line may be perpendicular to each other, or may inclined and intersected with each other as long as they are not parallel to each other and have intersection point, which is still covered by the scope of the present disclosure.

In addition, the present disclosure provides examples of parameters including specific values and however, it is not necessary for these parameters definitely equal to the corresponding value, instead, they may be suitable values that are approximate to the corresponding values within an acceptable error tolerance or design constrain. Further, the direction wordings in the above embodiments, such as "upper or above", "lower or below", "forwards", "backwards", "right", "left" are indicated with reference to the drawings and is not intended to limit the scope of the present disclosure. The above embodiments may be combined with each other or may be combined with other embodiments depending on consideration of design and reliability, that is, technical features in various embodiments may be freely combined to provide more other embodiments.

In sum, the present disclosure provides a novel thin film transistor array substrate and a display device implementing the same. The thin film transistor array substrate is designed such that the projection of the active layer overlapping section on the plane where the substrate is located is not configured in a straight line, and thus overlaps the projection of the first signal line on the plane where the substrate is located at two or more positions, thereby increasing the wiring efficiency and reliability.

Based on the above schemes, the thin film transistor array substrate and the display device implementing the same of the present disclosure have at least one of the advantages as listed below:

the projections of the active layer of the thin film transistor and the first signal line on the plane where the substrate is located are overlapped with each other in at least two positions, thereby providing a novel thin film transistor array substrate different from those in prior art;

Designing the active layer overlapping section such that its projection on the plane where the substrate is located is not configured in a straight line, or such that it includes at least the folded portion, or such that it includes the pattern, such as a shape of "U", a rectangle with a side opening, a shape of "山" or a shape of "W", having at least one side opening, so as to overlaps the projection of the first signal line on the plane where the substrate is located at two or more positions, thereby increasing the wiring efficiency and reliability.

For a thin film transistor array substrate composed of thin film transistors with the multiple gate structure, designing the active layer in a shape of "U" is in favor of simplification of the wiring structure and industrialization;

Based on the design of the U-shaped active layer, the date line is moved to the central position between the portions of the active layer that are parallel to each other, such that the parasitic capacitance between the data line and the channel of the thin film transistor is minimized and the pixel voltage error and twinkle are reduced.

Based on the design of the U-shaped active layer, the date line is moved to be close to or partially overlap the channel region that is apart away from the pixel electrode, such that the parasitic capacitance between the data line and the second channel portion, the parasitic capacitance between the data line and the drain electrode, and the parasitic capacitance between the data line and the pixel electrode are reduced, which is in favor of maintaining the pixel voltage to be stable.

The embodiments of the present disclosure may reduce or eliminate the pixel voltage error and twinkle due to the thin film transistor unit with a multiple-gate structure having larger parasitic capacitance, and thereby improving the display quality.

The above embodiments further describe the object, technical schemes and advantages of the present disclosure in detail. It is appreciated that the above description only relates to some specific embodiments of the present invention, but is not intended to limit the present invention. Any changes, equivalent replacement and modification within the spirit and principle of the present invention shall be fallen within the scope of the disclosure.

The invention claimed is:

1. A thin film transistor array substrate comprising:
a substrate;
a first signal line formed above the substrate;
a second signal line, wherein the first signal line and the second signal line define a functional region corresponding to at least one thin film transistor; and
a thin film transistor formed above the substrate,
wherein an active layer of the thin film transistor and the first signal line are located in different layers above the substrate and projections of the active layer of the thin film transistor and the first signal line on a plane where the substrate is located overlap with each other at at least two positions;
wherein the active layer of the thin film transistor comprises an active layer overlapping section, and the active layer overlapping section overlaps with the projection of the first signal line on the plane where the substrate is located; and
wherein the active layer overlapping section crossing the first signal line forms a first channel portion and a second channel portion of the thin film transistor, which are located at either side of the second signal line.

2. The thin film transistor array substrate according to claim 1, wherein:
the thin film transistor and the first signal line are independent of each other; or
the first signal line comprises: a gate electrode of the thin film transistor, and the gate electrode is configured such that a projection of the gate electrode on the substrate coincides with the first signal line; or, the gate electrode is coupled to the first signal line by a connection portion and the projection of the gate electrode on the substrate extends outside of the first signal line.

3. The thin film transistor array substrate according to claim 1, wherein:
the active layer overlapping section comprises at least one folded portion and a projection of the at least one folding portion on the plane where the substrate is located overlaps with the projection of the first signal line on the plane where the substrate is located at two, three or four positions; or
the active layer overlapping section comprises a pattern including at least one side opening, and a projection of the pattern on the plane where the substrate is located overlaps with the projection of the first signal line on the plane where the substrate is located at two, three or four positions.

4. The thin film transistor array substrate according to claim 1, wherein:
the active layer overlapping section is in a shape of "U", "V", character "山", "W" or hemicycle.

5. The thin film transistor array substrate according to claim 4, wherein:
a section of the second signal line located at a side of the functional region is formed as a signal line shifting section; and
the signal line shifting section shifts in a direction perpendicular to a general extending direction of the second signal line by a preset distance and the first channel portion and the second channel portion of the thin film transistor are located at either side of the signal line shifting section.

6. The thin film transistor array substrate according to claim 5, wherein: the first channel portion and the second channel portion of the thin film transistor are symmetrical about the signal line shifting section.

7. The thin film transistor array substrate according to claim 5, wherein:
the projection of the signal line shifting section on the plane where the substrate is located is close to the first channel portion and apart away from the second channel portion, or
the projection of the signal line shifting section on the plane where the substrate is located partially overlaps with a projection of the first channel portion on the plane where the substrate is located.

8. The thin film transistor array substrate according to claim 5, wherein: different signal line shifting sections of the second signal line shift in the same direction or different directions.

9. The thin film transistor array substrate according to claim 5, wherein:
the signal line shifting section shifts from the general extending direction of the second signal line by a distance d1, and 1 μm≤d1≤10 μm; and/or
a distance d2 between the first channel portion of the thin film transistor and the signal line shifting section satisfies 1 μm≤d2≤10 μm.

10. The thin film transistor array substrate according to claim 5, wherein: the signal line shifting section shifts, relative to the general extending direction of the second signal line, in a direction towards or away from the functional region by the present distance.

11. The thin film transistor array substrate according to claim 10, wherein:
the signal line shifting section shifts, relative to the general extending direction of the second signal line, in a direction away from the functional region by the present distance; and
the active layer further comprises an active layer connection section connecting a second portion of the active layer overlapping section that is apart away from the functional region with the second signal line.

12. The thin film transistor array substrate according to claim 10, wherein:
the signal line shifting section shifts, relative to the general extending direction of the second signal line, in a direction towards the functional region by the present distance; and a second portion of the active layer overlapping section that is apart away from the functional region is aligned with the general extending direction of the second signal line.

13. The thin film transistor array substrate according to claim 1, wherein:
a portion of the second signal line at a side of the functional region extends along a straight line; and
the active layer further comprises an active layer connection section connecting a second portion of the active layer overlapping section that is apart away from the functional region with the second signal line.

14. The thin film transistor array substrate according to claim 1, wherein:
the first signal line, the second signal line and a plurality of thin film transistors are formed in a display region of the thin film transistor array substrate; and
the first signal line is a gate line, the second signal line is a data line, two adjacent gate lines and two adjacent data lines define a pixel region, a first end of the thin film transistor is electrically connected to the data line and a second end of the thin film transistor is electrically connected to a pixel electrode in the pixel region.

15. The thin film transistor array substrate according to claim 14, wherein:
the second portion of the active layer overlapping section away from the pixel region is electrically connected to the data line through a first through hole; and
the first portion of the active layer overlapping section close to the pixel region is electrically connected to the drain electrode of the thin film transistor through a second through hole and is electrically connected to the pixel electrode in the pixel region through a third through hole.

16. The thin film transistor array substrate according to claim 1, wherein:
the first signal line and the thin film transistor are formed in a non-display region of the thin film transistor array substrate; and
a first end of the thin film transistor is electrically connected to the first signal line, the first signal line is a gate line or a data line, and a second end of the thin film transistor is electrically connected to a common electrode leading line.

17. The thin film transistor array substrate according to claim 1, wherein the first signal line and the second signal line are configured as a single-layer structure or a dual-layer structure.

18. The thin film transistor array substrate according to claim 1, wherein:
the thin film transistor is a dual-gate thin film transistor with a top gate structure, a gate insulating layer is formed over the active layer and the first signal line is formed over the gate insulating layer; and an interlayer separation layer is provided over the first signal line and the second signal lines passes over the interlayer separation layer; or
the thin film transistor is the dual-gate thin film transistor with the bottom gate structure, the gate insulating layer is formed over the first signal line and the active layer is formed over the gate insulating layer; and the second signal lines passes over the active layer and is separated from the active layer by the interlayer separation layer.

19. A display device comprising the thin film transistor array substrate according to claim 1.

* * * * *